US011222649B2

(12) United States Patent
Takahashi et al.

(10) Patent No.: US 11,222,649 B2
(45) Date of Patent: Jan. 11, 2022

(54) MIXING APPARATUS, MIXING METHOD, AND NON-TRANSITORY COMPUTER-READABLE RECORDING MEDIUM

(71) Applicants: The University of Electro-Communications, Tokyo (JP); Hibino Corporation, Tokyo (JP)

(72) Inventors: Kota Takahashi, Tokyo (JP); Tsukasa Miyamoto, Tokyo (JP); Yoshiyuki Ono, Tokyo (JP); Yoji Abe, Kanagawa (JP)

(73) Assignees: The University of Electro-Communications, Tokyo (JP); Hibino Corporation, Tokyo (JP)

( * ) Notice: Subject to any disclaimer, the term of this patent is extended or adjusted under 35 U.S.C. 154(b) by 0 days.

(21) Appl. No.: 17/047,524

(22) PCT Filed: Apr. 11, 2019

(86) PCT No.: PCT/JP2019/015834
§ 371 (c)(1),
(2) Date: Oct. 14, 2020

(87) PCT Pub. No.: WO2019/203126
PCT Pub. Date: Oct. 24, 2019

(65) Prior Publication Data

US 2021/0151068 A1 May 20, 2021

(30) Foreign Application Priority Data

Apr. 19, 2018 (JP) ............................. JP2018-080671

(51) Int. Cl.
*H04B 1/00* (2006.01)
*G10L 21/0332* (2013.01)
(Continued)

(52) U.S. Cl.
CPC ........... *G10L 21/0332* (2013.01); *H04R 3/00* (2013.01); *H04S 3/008* (2013.01); *G10L 21/0364* (2013.01); *H04R 2420/01* (2013.01)

(58) Field of Classification Search
CPC ... G10L 21/0332; G10L 21/0364; H04R 3/00; H04R 2420/01; H04S 3/008
(Continued)

(56) References Cited

U.S. PATENT DOCUMENTS 5,228,093 A 7/1993 Agnello
6,587,816 B1 7/2003 Chazan et al.
(Continued)

FOREIGN PATENT DOCUMENTS

EP 2860989 4/2015
JP 2010-081505 4/2010
(Continued)

OTHER PUBLICATIONS

Performance enhancement of smart mixer on condition of stereo playback), Dentsu University, 2017 (Year: 2017).*
(Continued)

*Primary Examiner* — Ammar T Hamid
(74) *Attorney, Agent, or Firm* — IPUSA, PLLC

(57) ABSTRACT

A mixing apparatus having a stereo output includes: a first signal processor that mixes a first signal and a second signal in a first channel; a second signal processor that mixes a third signal and a fourth signal in a second channel; a third channel that processes a weighted sum of a signal of the first channel and a signal of the second channel; and a gain deriving part that generates a gain mask commonly used in the first channel and the second channel, wherein the gain deriving part determines a first gain commonly applied to the first signal and the third signal, and a second gain commonly applied to the second signal and the fourth signal,
(Continued)

so that predetermined conditions for simultaneous gain generation are satisfied at least at the first channel and the second channel among the first channel, the second channel, and the third channel.

7 Claims, 6 Drawing Sheets

(51) Int. Cl.
*H04R 3/00* (2006.01)
*H04S 3/00* (2006.01)
*H03F 99/00* (2009.01)
*G10L 21/0364* (2013.01)

(58) Field of Classification Search
USPC .................................................. 381/119, 120
See application file for complete search history.

(56) References Cited

U.S. PATENT DOCUMENTS

| | | | |
|---|---|---|---|
| 9,715,884 | B2 | 7/2017 | Kitazawa |
| 2008/0269930 | A1 | 10/2008 | Yamashita et al. |
| 2010/0128882 | A1 | 5/2010 | Yamabe et al. |
| 2011/0317852 | A1 | 12/2011 | Kawano |
| 2012/0130516 | A1 | 5/2012 | Reinsch et al. |
| 2013/0272542 | A1 | 10/2013 | Tracey |
| 2014/0219478 | A1 | 8/2014 | Takahashi et al. |
| 2017/0048641 | A1 | 2/2017 | Franck |
| 2018/0035205 | A1 | 2/2018 | Vautin et al. |

FOREIGN PATENT DOCUMENTS

| | | |
|---|---|---|
| JP | 2012-010154 | 1/2012 |
| JP | 2013-051589 | 3/2013 |
| JP | 2013-164572 | 8/2013 |
| JP | 2016-134706 | 7/2016 |
| JP | 2016134706 A * | 7/2016 |
| WO | 2006/085265 | 8/2006 |

OTHER PUBLICATIONS

Katsuyama et al. (Performance enhancement of smart mixer on condition of stereo playback), Dentsu University, 2017 (Year: 2017).*
International Search Report dated May 21, 2019 with respect to PCT/JP2019/015832.
International Search Report dated May 21, 2019 with respect to PCT/JP2019/015837.
International Search Report dated May 28, 2019 with respect to PCT/JP2019/015834.
Sep. 27, 2017, pp. 465-468, ISSN 1880-7658, in particular, pp. 465-466, fig. 3-4, non-official translation (Katsuyama, Shun et al., "Performance enhancement of smart mixer on condition of stereo playback", Lecture proceedings of 2017 autumn meeting the Acoustical Society of Japan CD-ROM, Acoustical Society of Japan).
Florencio D A F ED—Institute of Electrical and Electronics Engineers: "On the use of asymmetric windows for reducing the time delay in real-time spectral analysis", Speech Processing 1. Toronto, May 14-17, 1991; [International Conference on Acoustics, Speech & Signal Processing. ICASSP], New York, IEEE, US, vol. Conf. 16, Apr. 14, 1991 (Apr. 14, 1991), pp. 3261-3264, XP010043720, DOI: 10.1109/ICASSP.1991.150149 ISBN: 978-0-7803-0003-3 the whole document.
Extended European Search Report dated Apr. 29, 2021 with respect to the related European Patent Application No. 19787973.2.
Partial Search Report dated Apr. 29, 2021 with respect to the related European Patent Application No. 19787843.2.
Extended European Search Report dated May 18, 2021 with respect to the corresponding European Patent Application No. 19788613.8.
Extended European Search Report dated Aug. 25, 2021 with respect to the corresponding European Patent Application No. 19787843.2.
Office Action dated Nov. 29, 2021 issued with respect to the related U.S. Appl. No. 17/047,504.

* cited by examiner

MIXING APPARATUS, MIXING METHOD, AND NON-TRANSITORY COMPUTER-READABLE RECORDING MEDIUM

TECHNICAL FIELD

The present invention relates to a mixing technique of an input signal, and in particular to a stereo (a stereophonic sound) mixing technique.

BACKGROUND ART

A smart mixer is a new sound-mixing method that can increase an articulation of a priority sound by mixing the priority sound and a non-priority sound on a time-frequency plane while maintaining a sound volume impression of the non-priority sound (see, for example, Patent Document 1). Signal characteristics are determined at each point on the time-frequency plane, and processes are performed so as to increase the articulation of the priority sound in accordance with the signal characteristics. However, in a case where the smart mixing focuses on the articulation of the priority sound, some side effects with respect to the non-priority sound (a sense of missing sound) occur. Herein, the priority sound is sound, such as speech, vocals, solo parts, or the like, that is provided to an audience member preferentially. The non-priority sound is sound, such as background sound, an accompaniment, or the like. The non-priority sound is sound other than the priority sound.

In order to suppress the sense of missing sound that occurs in the non-priority sound, a method is proposed in which gains applied to the priority sound and the non-priority sound are determined in an appropriate manner so as to produce more natural mixed sound (see, for example, Patent Document 2).

FIG. 1 is a schematic diagram of a conventional smart mixer. A priority signal that expresses the priority sound, and a non-priority signal that expresses the non-priority sound, are expanded on the time-frequency plane, respectively, by multiplying a window function to the priority signal and the non-priority signal, to perform a short-time Fast Fourier Transform (FFT). Powers of the priority sound and the non-priority sound are respectively calculated on the time-frequency plane, and smoothened in a time direction. A gain $\alpha_1$ of the priority sound and a gain $\alpha_2$ of the non-priority sound are derived, based on smoothened powers of the priority sound and the non-priority sound. The priority sound and the non-priority sound are multiplied by the gains $\alpha_1$ and $\alpha_2$, respectively, and then added to each other. The addition result is restored to a signal in a time domain, and output.

Two basic principles are used to derive the gains, namely, the "principle of the sum of logarithmic intensities" and the "principle of fill-in". The "principle of the sum of logarithmic intensities" limits the logarithmic intensity of the output signal to a range not exceeding the sum of the logarithmic intensities of the input signals. The "principle of the sum of logarithmic intensities" suppresses an uncomfortable feeling that may occur with regard to a mixed sound due to excessive emphasis of the priority sound. The "principle of fill-in" limits a decrease of the power of the non-priority sound to a range that does not exceed a power increase of the priority sound. The "principle of fill-in" suppresses the uncomfortable feeling that may occur with regard to the mixed sound due to excessive decrease of the non-priority sound. A more natural mixed sound is output by rationally determining the gain based on these principles.

PRIOR ART DOCUMENTS

Patent Document

Patent Document 1: Japanese Patent No. 5057535
Patent Document 2: Japanese Laid-Open Patent Publication No. 2016-134706

DISCLOSURE OF THE INVENTION

Problem to be Solved by the Invention

The conventional methods presuppose monaural output. Although monaural output is generally obtained from a single speaker or a single output terminal, cases in which a plurality of output terminals output the same sounds as each other are also treated as monophonic reproducing. In contrast, stereophonic reproducing is a case where different sounds are output from a plurality of output terminals.

If the mixing method of Patent Document 1 can be extended to the stereophonic reproducing, it becomes possible to generate stereo signals that are not defective and can be heard in any form such as listening with a headphone and listening at a concert in a very large hall. The mixing method extended to the stereophonic reproducing can be applied to mixing techniques in a recording studio.

However, in a case where the mixing method of Patent Document 1 is applied to the stereophonic reproducing, it is not obvious how to extend the aforementioned "principle of the sum of logarithmic intensities" and the "principle of fill-in".

Accordingly, the present disclosure provides a mixing technique that can suppress an occurrence of a defect with respect to a reproduced sound and can output the reproduced sound with natural sound quality, even if a smart mixing technique is extended to stereophonic reproducing.

Means of Solving the Problem

According to a first aspect of the present invention, with respect to a mixing apparatus that outputs stereophonic output, the mixing apparatus includes

- a first signal processor that mixes a first signal and a second signal at a first channel;
- a second signal processor that mixes a third signal and a fourth signal at a second channel;
- a third channel that processes a weighted sum of a signal at the first channel and a signal at the second channel; and
- a gain deriving part that generates a gain mask commonly used in the first channel and the second channel;
- wherein the gain deriving part determines a first gain commonly applied to the first signal and the third signal, and a second gain commonly applied to the second signal and the fourth signal so that designated conditions for gain generations are satisfied simultaneously at least at the first channel and the second channel among the first channel, the second channel, and the third channel.

According to a second aspect of the present invention, with respect to a mixing apparatus that outputs stereophonic output, the mixing apparatus includes

- a first signal processor that mixes a first signal and a second signal at a first channel;
- a second signal processor that mixes a third signal and a fourth signal at a second channel;

a third channel that processes a weighted sum of a signal at the first channel and a signal at the second channel;

a first gain deriving part that generates a first gain mask used in the first channel; and a second gain deriving part that generates a second gain mask used in the second channel;

wherein the first gain deriving part generates the first gain mask so that a designated condition for a gain generation is satisfied at the third channel, and wherein the second gain deriving part generates the second gain mask so that the designated condition is satisfied at the third channel.

Effects of the Invention

According to the configuration described above, it is possible to suppress an occurrence of a defect with respect to a reproduced sound and to output the reproduced sound with natural sound quality, even if a smart mixing technique is extended to stereophonic reproducing.

MODE OF CARRYING OUT THE INVENTION

Figure 1:
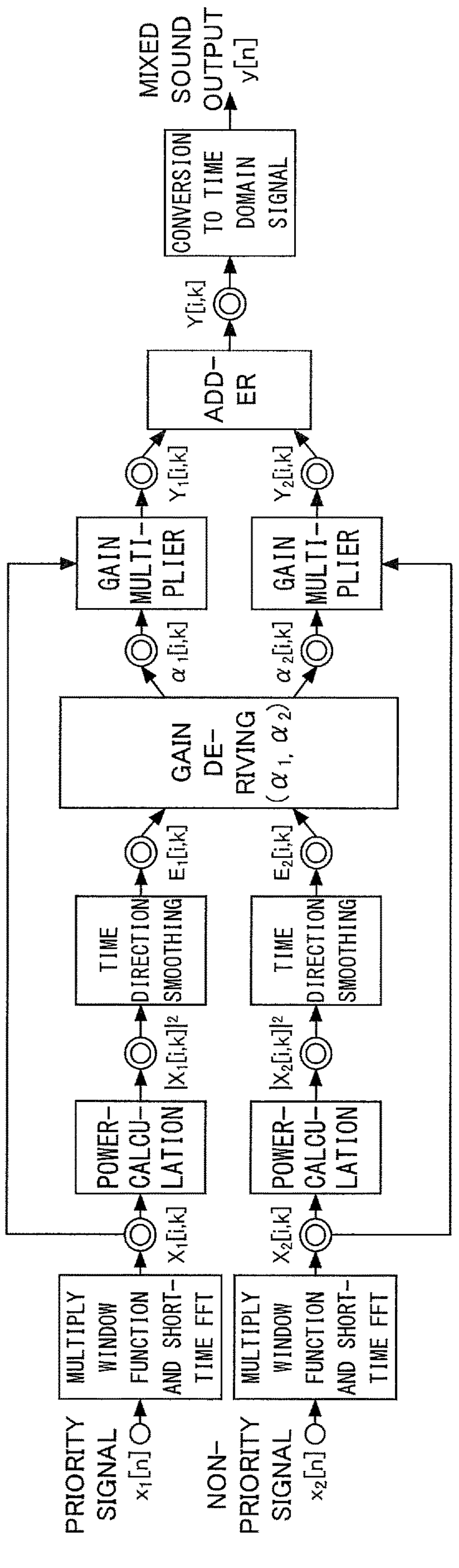
FIG. 1 is a schematic diagram of a conventional smart mixer.

A simplest way to extend a conventional configuration of FIG. 1 to stereo is to arrange two processing systems of FIG. 1 in parallel, and one is dedicated to a left channel (an L channel) and the other is dedicated to the right channel (R channel). In this case, the "principle of the sum of logarithmic intensities" and the "principle of fill-in" are applied to each channel. Accordingly, if a listener listens to one of the channels individually, the listener obtains a satisfactory result from each channel.

However, this simple configuration has the following problems. For example, suppose that a priority sound is localized at a center. Since a gain $\alpha_{1L}[i, k]$ of the L channel of the priority sound at a point (i, k) on a time-frequency plane and a gain $\alpha_{1R}[i, k]$ of the R channel of the priority sound at a same point (i, k) as that of the L channel are set in separate processing systems (blocks) independently, the gain $\alpha_{1L}[i, k]$ and the gain $\alpha_{1R}[i, k]$ may be set to different values. The different values such as these may occur at every point (i, k) on the time-frequency plane, and differences of the different values at a plurality of the points (i, k) may be different to each other. As a result, the localization of the priority sound in the center may be shifted. For example, in a case where the priority sound is a vocal sound, a localization of the vocal sound is shifted every moment. If the vocal sound is reproduced in stereo, a listener listens to the vocal sound shifting to the left and to the right.

Figure 2:
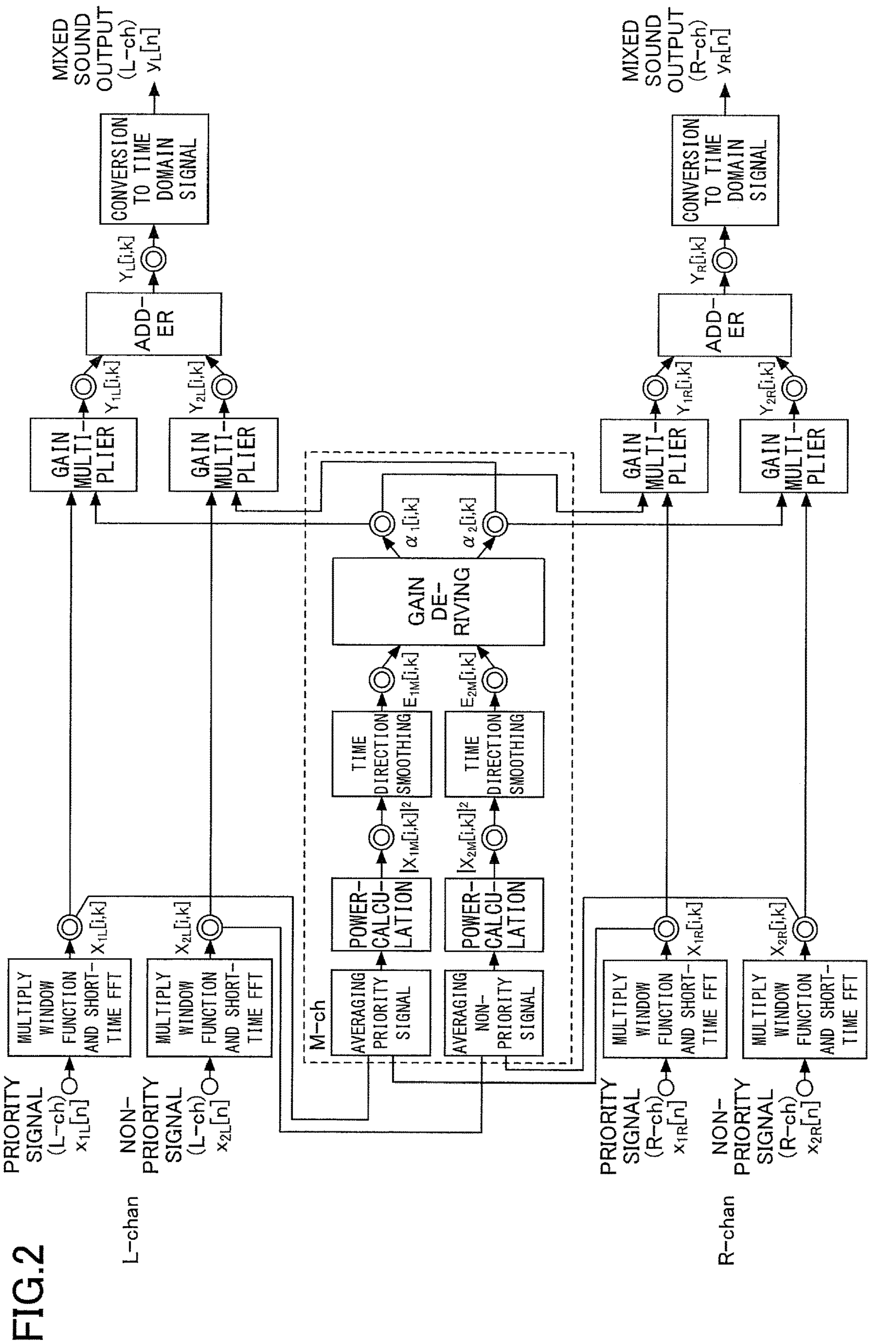
FIG. 2 illustrates a configuration of a possible stereo system in a process leading to the present invention.

FIG. 2 illustrates a configuration example of a possible stereo system in a process leading to the present invention. In FIG. 2, mixing is performed in a case where a gain $\alpha_1[i, k]$ is commonly applied to the L channel and the R channel of the priority sound, and a gain $\alpha_2[i, k]$ is commonly applied to the L channel and the R channel of a non-priority sound.

In order to suppress the shifting of the localization of the priority sound, the gain $\alpha_{1L}[i, k]$ of the priority sound at the point (i, k) on the time-frequency plane at the L channel and the gain $\alpha_{1R}[i, k]$ of the priority sound at the point (i, k) on the time-frequency plane at the R channel are always set to be equal values. The gain $\alpha_{1L}[i, k]$ and the gain $\alpha_{1R}[i, k]$ having the equal values to each other are referred to as the gain $\alpha_1[i, k]$.

With respect to the non-priority sound, in order to suppress the shifting of the localization, the gain $\alpha_{2L}[i, k]$ of the non-priority sound at the point (i, k) on the time-frequency plane at the L channel and the gain $\alpha_{2R}[i, k]$ of the non-priority sound at the point (i, k) on the time-frequency plane at the R channel are always set to be equal values. The gain $\alpha_{2L}[i, k]$ and the gain $\alpha_{2R}[i, k]$ having the equal values to each other are referred to as the gain $\alpha_2[i, k]$.

For the priority sound, a monaural channel (M channel) that is obtained by averaging the L channel and the R channel of the priority sound is provided, and the gain $\alpha_1[i, k]$ that is commonly used for the L channel and the R channel of the priority sound is generated. For the non-priority sound, a monaural channel (M channel) that is obtained by averaging the L channel and the R channel of the non-priority sound is provided, and the gain $\alpha_2[i, k]$ that is commonly used for the L channel and the R channel of the non-priority sound is generated. An average value obtained by the averaging may not be necessarily used, and an addition value of the L channel and the R channel may be used.

A gain mask is generated by a principle of monaural smart mixing using signals at the M channel. That is, a power (a square of an amplitude) is calculated from the average value or the addition value of a signal $X_{1L}[i, k]$ of the priority sound in the time-frequency axis at the L channel and a signal $X_{1R}[i, k]$ of the priority sound in the time-frequency axis at the R channel, and a smoothened power $E_{1M}[i, k]$ in a time direction is obtained. Similarly, a power is calculated from the average value or the addition value of a signal $X_{2L}[i, k]$ of the non-priority sound in the time-frequency axis at the L channel and a signal $X_{2R}[i, k]$ of the non-priority sound in the time-frequency axis at the R channel, and a smoothened power $E_{2M}[i, k]$ in the time direction is obtained. The common gains $\alpha_1[i, k]$ and $\alpha_2[i, k]$ are derived from the smoothened power $E_{1M}[i, k]$ of the priority sound and the smoothened power $E_{2M}[i, k]$ of the non-priority sound. The gains $\alpha_1[i, k]$ and $\alpha_2[i, k]$ are calculated according to the "principle of the sum of logarithmic intensities" and the "principle of fill-in" as disclosed in Patent Document 2.

The signal $X_{1L}[i, k]$ of the priority sound at the L channel and the signal $X_{1R}[i, k]$ of the priority sound at the R channel are multiplied by the obtained gain $\alpha_1[i, k]$. The signal $X_{2L}[i, k]$ of the non-priority sound at the L channel and the signal $X_{2R}[i, k]$ of the non-priority sound at the R channel are multiplied by the obtained gain $\alpha_2[i, k]$. The multiplied results at the L channel are added together, and the addition value is restored in a time domain. The multiplied results at the R channel are added together, and the addition value is restored in the time domain. It is possible to prevent a shifting of a localization of mixed sounds by outputting the restored addition values.

Since the "principle of fill-in" is applied only to the M channel, another problem arises. For example, consider a case of an audience member who is standing right in front of a speaker of one of the channels (e.g., the R channel) in a large hall or a large stadium. The audience member mostly does not hear to the sound at the L channel, and mostly hear the sound at the R channel.

Suppose that an instrument IL is played at the L channel and another instrument IR is played at the R channel. In a case where a vocal (the priority sound) is produced at the L channel at a certain moment, gain suppression is performed at both of the L channel and the R channel of the non-priority sound according to the "principle of fill-in". As a result, the musical instrument IR is partially attenuated on the time-frequency plane, even though there is almost no vocal sound at the R channel. The audience member standing in front of the speaker at the R channel perceives deterioration (missing) of the sound of the instrument IR.

Such a failure is caused by incorrect functioning of the "principle of fill-in" with respect to the sound output from the R channel. Accordingly, a new configuration further refining the configuration of FIG. 2 is desirable.

First Embodiment

Figure 3:
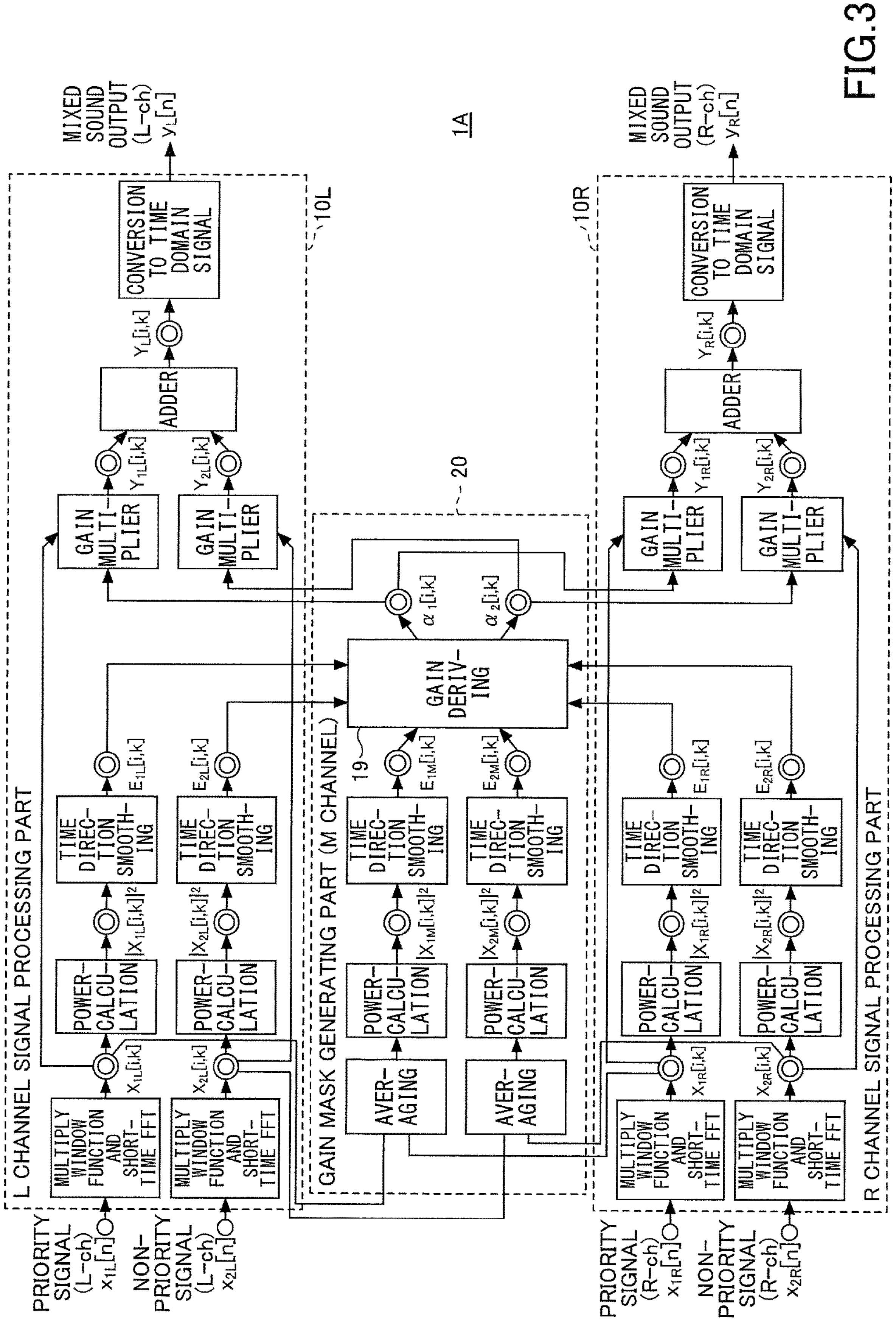
FIG. 3 is an outline block diagram of a mixing apparatus 1A according to a first embodiment.

FIG. 3 is a configuration example of the mixing apparatus 1A according to the first embodiment. Discussions described above lead to the followings. First, it is important to maintain the localization in order to apply the smart mixing to the stereo. Second, while maintaining the localization, the mixing apparatus 1A should not make audience members listening to only one of the speakers feel deterioration (missing) of the non-priority sound.

In order to maintain the localization, it is necessary to use a common gain mask, and a monaural processing for gain generation is basically required. On the other hand, in order to suppress the deterioration of the non-priority sound, principle of fill-in must be applied for each individual channel, and a stereo processing is basically required.

The mixing apparatus 1A according to the first embodiment satisfies these two requirements. In the mixing apparatus 1A, a common gain mask is generated by the monaural processing and used at the L channel and the R channel. Further, the "principle of fill-in" is reflected not only at the M channel but also at the L channel and the R channel.

The mixing apparatus 1A includes an L channel signal processing part 10L, an R channel signal processing part 10R, and a gain mask generating part 20. In the example of FIG. 3, the gain mask generating part 20 functions as the M channel, but the gain deriving part 19 may not necessarily be disposed in a processing system at the M channel but may be disposed outside the processing system at the M channel.

A signal $x_{1L}$ [n] of the priority sound, such as the voice and the like, and a signal $x_{2L}$ [n] of the non-priority sound, such as a background sound and the like, are input to the L channel signal processing part 10L. A frequency analysis, such as a short-time FFT or the like, is applied to each of the input signals, and a signal $X_{1L}[i, k]$ of the priority sound and a signal $X_{2L}[i, k]$ of the non-priority sound on the time-frequency plane are generated. Herein, a signal on the time axis is represented by a small letter x, and a signal on the time-frequency plane is represented by a capital letter X.

The signal $X_{1L}[i, k]$ of the priority sound and the signal $X_{2L}[i, k]$ of the non-priority sound are input to the M channel that is realized by the gain mask generating part 20. In the L channel signal processing part 10L, each of the signal $X_{1L}[i, k]$ of the priority sound and the signal $X_{2L}[i, k]$ of the non-priority sound is subjected to power calculation and smoothing process in the time direction. As a result of this, smoothened power $E_{1L}[i, k]$ of the priority sound in the time direction and smoothened power $E_{2L}[i, k]$ of the non-priority sounds in the time direction are obtained.

A signal $x_{1R}$ [n] of the priority sound, such as voice and the like, and a signal $x_{2R}$ [n] of the non-priority sound, such as the background sound and the like, are input to the R channel signal processing part 10R. A frequency analysis, such as the short-time FFT or the like, is applied to each of the input signals, and a signal $X_{1R}[i, k]$ of the priority sound and a signal $X_{2R}[i, k]$ of the non-priority sound on the time-frequency plane are generated.

The signal $X_{1R}[i, k]$ of the priority sound and the signal $X_{2R}[i, k]$ of the non-priority sound are input to the M channel that is realized by the gain mask generating part 20. In the R channel signal processing part 10R, each of the signal $X_{1R}[i, k]$ of the priority sound and the signal $X_{2R}[i, k]$ of the non-priority sound is subjected to power calculation and smoothing process in the time direction. As a result of this, smoothened power $E_{1R}[i, k]$ of the priority sound in the time direction and smoothened power $E_{2R}[i, k]$ of the non-priority sounds in the time direction are obtained.

In the gain mask generating part 20 that forms the M channel, smoothened power $E_{1M}[i, k]$ in the time direction is generated by using an average (or an addition value) of the signal $X_{1L}[i, k]$ of the priority sound on the time-frequency plane at the L channel and the signal $X_{1R}[i, k]$ of the priority sound on the time-frequency plane at the R channel. Similarly, smoothened power $E_{2M}[i, k]$ in the time direction is generated by using an average (or an addition value) of the signal $X_{2L}[i, k]$ of the non-priority sound on the time-frequency plane at the L channel and the signal $X_{2R}[i, k]$ of the non-priority sound on the time-frequency plane at the R channel.

Accordingly, at each of the M channel, the L channel, and the R channel, smoothened power $E_1[i, k]$ in the time direction and smoothened power $E_2[i, k]$ in the time direction at each point on the time-frequency plane (i, k) are obtained. (Herein, $E_{1M}$, $E_{1L}$, and $E_{1R}$ are collectively referred to as $E_1$. The same applies to $E_2$.)

Three pairs of the smoothened power are input to the gain deriving part 19. The three pairs are the smoothened power $E_{1M}[i, k]$ and $E_{2M}[i, k]$ obtained at the gain mask generating part 20, the smoothened power $E_{1L}[i, k]$ and $E_{2L}[i, k]$ obtained at the L channel signal processing part 10L, and the smoothened power $E_{1R}[i, k]$ obtained at the R channel signal processing part 10R and the smoothened power $E_{2R}[i, k]$ obtained at the R channel signal processing part 10R.

The gain deriving part 19 generates $\alpha_1[i, k]$ and $\alpha_2[i, k]$, that are common gain masks, from the three pairs and six parameters that are input thereto. The pair of gains $\alpha_1[i, k]$ and $\alpha_2[i, k]$ is supplied to the L channel signal processing part 10L and the R channel signal processing part 10R, and is used for a multiplying process of gain with respect to signals $X_1[i, k]$ of the priority sound and signals $X_2[i, k]$ of the non-priority sound. (Herein, $X_{1L}$ and $X_{1R}$ are collectively denoted as $X_1$. The same applies to $X_2$.) After the gains are multiplied, the priority sounds and the non-priority sounds are added, restored in the time domain, and output from the L channel and the R channel.

In this configuration, while assuming the common gain masks, principle of fill-in is applied to the L channel and the R channel in the gain deriving part 19, and the gain masks ($\alpha_1$[i, k] and $\alpha_2$[i, k]) are generated. Details of this will be described hereinafter. Variables used in the following description are illustrated in Table 1.

TABLE 1

| MEANINGS OF PARAMETER | PRIORITY SOUND | NON-PRIORITY SOUND | TYPE |
|---|---|---|---|
| INPUT IN THE TIME-FREQUENCY DOMAIN | $X_1[i, k]$ | $X_2[i, k]$ | COMPLEX NUMBER |
| GAIN BETWEEN INPUT AND OUTPUT | $\alpha_1[i, k]$ | $\alpha_2[i, k]$ | POSITIVE REAL NUMBER |
| OUTPUT IN THE TIME-FREQUENCY DOMAIN | $Y[i, k]$ | | COMPLEX NUMBER |
| SMOOTHENED POWER | $E_1[i, k]$ | $E_2[i, k]$ | COMPLEX NUMBER |
| LISTENING CORRECTION POWER | $P_1[i, k]$ | $P_2[i, k]$ | POSITIVE REAL NUMBER |
| LISTENING CORRECTION POWER WITH $\alpha_j$ BEFORE BEING UPDATED | $L_1[i, k]$ | $L_2[i, k]$ | POSITIVE REAL NUMBER |
| $L_1[i, k] + L_2[i, k]$ | $L[i, k]$ | | POSITIVE REAL NUMBER |
| LISTENING CORRECTION POWER OF MIXING OUTPUT WHEN GAIN IS INCREASED | $L_p$ | | POSITIVE REAL NUMBER |

First, as illustrated in formula (0), a listening correction coefficient B[k] that is an inverse number of a minimum audible power A[k] is obtained.

$$A[k] = \left(x_{max}\sum_n h[n]\right)^2 \exp\left(\frac{\log(10)}{10}\left(C_{L_p}[i] - S\right)\right), \quad (0)$$

$$B[k] = \frac{1}{A[k]} = \frac{1}{\left(x_{max}\sum_n h[n]\right)^2}\exp\left(-\frac{\log(10)}{10}\left(C_{L_p}[k] - S\right)\right)$$

Herein, $C_{Lp}$[i] is data that is sampled by extracting a main portion of a smallest audible curve (Lp) selected from equal-loudness curves. A constant S is a constant used for setting, in a case where the input signal $x_j$[n] (j=1, 2) in the time domain is a full-scale-signal, a sound pressure level of the full-scale signal in a vertical axis of the equal-loudness curve.

The listening correction coefficient B[k] is a correction coefficient for processing the smoothened power $E_j$[i, k] in the time direction obtained from the input signal in accordance with a sense of hearing of a human. If a result obtained by dividing the smoothened power $E_j$[i, k] by the minimum audible power A[k] is greater than 1, a human can hear a sound. An audible level thereof is expressed as $E_j$[i, k]/A[k]. For example, if the $E_j$[i, k]/A[k] is 100, a sound has power that is 100 times more compared to that of the minimum audible sound. Herein, the listening correction coefficient B[k] that is the inverse number of A[k] is used, instead of dividing A[k].

Six listening correction powers $P_j$[i, k] are obtained from the six smoothened powers $E_j$[i, k] input to the gain deriving part 19 through formulas (1) to (6) by using the listening correction coefficient B[k].

$$P_{1M}[i, k] = B[k]E_{1M}[i, k] \quad (1)$$

$$P_{2M}[i, k] = B[k]E_{2M}[i, k] \quad (2)$$

$$P_{1L}[i, k] = B[k]E_{1L}[i, k] \quad (3)$$

$$P_{2L}[i, k] = B[k]E_{2L}[i, k] \quad (4)$$

$$P_{1R}[i, k] = B[k]E_{1R}[i, k] \quad (5)$$

$$P_{2R}[i, k] = B[k]E_{2R}[i, k] \quad (6)$$

A boost determination is performed in a case where the priority sound is sounded and an SNR is low (see Patent Document 2). However, herein, a boost process is omitted for simplicity. In other words, a boost determination formula b[i] of Patent Document 2 is always set to "1."

Next, six listening correction powers $L_j$[i, k] with the gains, of six input parameters, that are before being updated are calculated based on formulas (7) to (12).

$$L_{1M}[i, k] = \alpha_1[i-1, k]^2 P_{1M}[i, k] \quad (7)$$

$$L_{2M}[i, k] = \alpha_2[i-1, k]^2 P_{2M}[i, k] \quad (8)$$

$$L_{1L}[i, k] = \alpha_1[i-1, k]^2 P_{1L}[i, k] \quad (9)$$

$$L_{2L}[i, k] = \alpha_2[i-1, k]^2 P_{2L}[i, k] \quad (10)$$

$$L_{1R}[i, k] = \alpha_1[i-1, k]^2 P_{1R}[i, k] \quad (11)$$

$$L_{2R}[i, k] = \alpha_2[i-1, k]^2 P_{2R}[i, k] \quad (12)$$

The listening correction power $L_j$[i, k] that is obtained after the gain is adjusted is calculated by applying the gain obtained at a point (i−1, k) to the listening correction power $P_j$[i, k] at the point (i, k) on the time-frequency plane.

At each of the M channel, the L channel, and the R channel, the listening correction power $L_j$[i, k] of the mixing output is expressed by each of formulas (13) to (15) as a sum of contributions of the priority sound and the non-priority sound.

$$L_M[i, k] = L_{1M}[i, k] + L_{2M}[i, k] \quad (13)$$

$$L_L[i, k] = L_{1L}[i, k] + L_{2L}[i, k] \quad (14)$$

$$L_R[i, k] = L_{1R}[i, k] + L_{2R}[i, k] \quad (15)$$

Suppose that if the listening correction power, in a case where the gain of the priority sound is increased by $\Delta_1$, is defined as $L_{1p}$[i, k], the listening correction power after the gain of the priority sound at each channel is increased is expressed by each of formulas (16) to (18).

$$L_{1pM}[i, k] = ((1+\Delta_1)\alpha_1[i-1, k])^2 P_{1M}[i, k] \quad (16)$$

$$L_{1pL}[i, k] = ((1+\Delta_1)\alpha_1[i-1, k])^2 P_{1L}[i, k] \quad (17)$$

$$L_{1pR}[i, k] = ((1+\Delta_1)\alpha_1[i-1, k])^2 P_{1R}[i, k] \quad (18)$$

Suppose that if the listening correction power of the mixing output, in a case where the gain is increased, is $L_p$[i, k], the listening correction power of the mixing output after the gain is increased in each channel is as expressed by each of formulas (19) to (21).

$$L_{pM}[i, k] = L_{1pM}[i, k] + L_{2M}[i, k] \quad (19)$$

$$L_{pL}[i, k] = L_{1pL}[i, k] + L_{2L}[i, k] \quad (20)$$

$$L_{pR}[i, k] = L_{1pR}[i, k] + L_{2R}[i, k] \quad (21)$$

On the other hand, suppose that if the listening correction power, in a case where the gain of the non-priority sound is decreased by $\Delta_2$, is defined as $L_{2m}[i, k]$, the listening correction power after the gain of the non-priority sound at each channel is decreased is expressed by each of formulas (22) to (24).

$$L_{2mM}[i, k]=(\alpha_2[i-1, k]-\Delta_2)^2 P_{2M}[i, k] \quad (22)$$

$$L_{2mL}[i, k]=(\alpha_2[i-1, k]-\Delta_2)^2 P_{2L}[i, k] \quad (23)$$

$$L_{2mR}[i, k]=(\alpha_2[i-1, k]-\Delta_2)^2 P_{2R}[i, k] \quad (24)$$

Suppose that if the listening correction power, in a case where the adjusted gain $\alpha_1[i, k]$ is used, is defined as $L_{1\alpha}[i, k]$, the listening correction power for the priority sound using the adjusted gain $\alpha_1[i, k]$ at each channel is expressed by each of formulas (25) to (27).

$$L_{1\alpha M}[i, k]=\alpha_1[i, k]^2 P_{1M}[i, k] \quad (25)$$

$$L_{1\alpha L}[i, k]=\alpha_1[i, k]^2 P_{1L}[i, k] \quad (26)$$

$$L_{1\alpha R}[i, k]=\alpha_1[i, k]^2 P_{1R}[i, k] \quad (27)$$

Next, updating conditions of the gain will be described. An increase in $\alpha_1$ for the priority sound, that is, a process of $\alpha_1[i, k]=(1+\Delta 1)\alpha_1[i-1, k]$, is performed in a case where all of conditions expressed by formulas (28) to (32) are satisfied.

$$P_{1M}[i, k]\geq 1 \quad (28)$$

$$P_{2M}[i, k]\geq 1 \quad (29)$$

$$L_{pM}[i, k]\leq P_{1M} P_{2M} \quad (30)$$

$$(\alpha_1[i-1, k](1+\Delta_1))^2\leq T_{1H}^2 \quad (31)$$

$$L_{pM}[i, k]<T_G^2(P_{1M}[i, k]+P_{2M}[i, k]) \quad (32)$$

Formulas (28) and (29) mean that $\alpha_1$ is increased only when both the priority sound and the non-priority sound are audible at the M channel (i.e., at a weighted sum of the L channel and the R channel). Accordingly, amplification of the priority sound and attenuation of the non-priority sound are suppressed, for example, when no vocals are included. Formula (30) functions so that a logarithm intensity (power) of the mixed sounds does not exceed a sum of a logarithm intensity of the priority sound and a logarithm intensity of the non-priority sound ("principle of the sum of logarithmic intensities").

$T_{IH}$ of formula (31) is an upper limit of the gain of the priority sound, and $T_G$ of formula (32) is an amplification limit of the mixing power. $T_{IH}$ suppresses the gain of the priority sound less than or equal to a certain value. Unlike a case of simple summation, $T_G$ suppresses an increase in power less than or equal to a certain limit ($T_G$ times in an amplitude ratio) even at one or more local points on the time-frequency plane.

Next, the decrease of $\alpha_1$, that is, a process of $\alpha_1[i, k]=(1+\Delta_1)^{-1}\alpha_1[i-1, k]$, is performed in a case where any one of formulas (33) to (37) is established and formula (38) is established.

$$P_{1M}[i, k]<1 \quad (33)$$

$$P_{2M}[i, k]<1 \quad (34)$$

$$L_M[i, k]>P_{1M}P_{2M} \quad (35)$$

$$(\alpha_1[i-1, k])^2>T_{1H}^2 \quad (36)$$

$$L_M[i, k]>T_G^2(P_{1M}[i, k]+P_{2M}[i, k] \quad (37)$$

$$\alpha_1[i-1, k]>1 \quad (38)$$

Formulas (33) and (34) mean that the gain of the priority sound is restored (decreased) in a case where at least one of the priority sound and the non-priority sounds does not meet the audible level at the point (i, k) on the time-frequency plane. Formula (35) operates in a direction for reducing the gain of the priority sound in a case where the logarithm intensity of the mixed sound exceeds the sum of the logarithm intensity of the priority sound and the logarithm intensity of the non-priority sound. In a case where the gain $\alpha_1$ exceeds the upper limit $T_{1H}$, formula (36) eliminates an excess of the gain $\alpha_1$. Formula (37) operates in a direction for reducing the gain of the priority sound in a case where the gain of the priority sound exceeds a level obtained by multiplying a designated magnification (ratio) $T_G$ to a mixed sound obtained by simple addition. Formula (38) decreases the gain of the priority sound only in a case where the gain of the priority sound is greater than 1.

Next, a decrease of $\alpha_2$ for the non-priority sound, that is, a process of $\alpha_2[i, k]=\alpha_2[i-1, k]-\Delta_2$, is performed in a case where all of conditions of formulas (39) to (42) are satisfied.

$$L_{1\alpha M}[i, k]-P_{1M}[i, k]>P_{2M}[i, k]-L_{2mM}[i, k] \quad (39)$$

$$L_{1\alpha L}[i, k]-P_{1L}[i, k]>P_{2L}[i, k]-L_{2mL}[i, k] \quad (40)$$

$$L_{1\alpha R}[i, k]-P_{1R}[i, k]>P_{2R}[i, k]-L_{2mR}[i, k] \quad (41)$$

$$\alpha_2[i-1, k]-\Delta_2\geq T_{2L} \quad (42)$$

Herein, $T_{2L}$ is a lower limit of the gain of the non-priority sounds.

Formula (39) represents a fill-in condition for the monaural (M channel), formula (40) represents the fill-in condition for the L channel, and formula (41) represents the fill-in condition for the R channel. The decrease of $\alpha_2$ can be performed only when all these three conditions are satisfied. Therefore, an simplistic suppression of the non-priority sound is prevented.

Finally, an increase in $\alpha_2$, that is, a process of $\alpha_2[i, k]=\alpha_2[i-1, k]+\Delta_2$, is performed in a case where any one of formulas (43) to (45) is satisfied and formula (46) is satisfied.

$$L_{1\alpha M}[i, k]-P_{1M}[i, k]<P_{2M}[i, k]-L_{2M}[i, k] \quad (43)$$

$$L_{1\alpha L}[i, k]-P_{1L}[i, k]<P_{2L}[i, k]-L_{2L}[i, k] \quad (44)$$

$$L_{1\alpha R}[i, k]-P_{1R}[i, k]<P_{2R}[i, k]-L_{2R}[i, k] \quad (45)$$

$$\alpha_2[i-1, k]<1 \quad (46)$$

Formula (43) represents the fill-in condition for the monaural (M channel), formula (44) represents the fill-in condition for the L channel, and formula (45) represents the fill-in condition for the R channel. The increase of $\alpha_2$ can be performed, for example, in a case where there is no priority sound such as the vocal sound. If one of three conditions of formulas (43) to (45) becomes likely to break down, the increase of $\alpha_2$ is stopped and a breakdown of the fill-in condition is prevented.

A method described above assumes that the common gain mask is used for the L channel and the R channel, and adjusts the gain while maintaining that the conditions of the principle of fill-in are satisfied for the M channel, the L channel, and the R channel. The process at the M channel is a gain updating with respect to the weighted sum (or a linear sum)

of the output at the L channel and the output at the R channel based on the principle of fill-in.

On the other hand, if the principle of fill-in is established with respect to both of the L channel and the R channel, the principle of fill-in is established with respect to the M channel in most cases. In this case, the conditions of the fill-in with respect to the monaural of formulas (39) and (43) can be omitted. That is, the gains are determined so that the condition of the principle of fill-in for the output at the L channel and the condition of the principle of fill-in for the output at the R channel are satisfied simultaneously.

Accordingly, a configuration generating the gains so that the conditions of the principle of fill-in are satisfied simultaneously at least for the L channel and the R channel among the M channel, the L channel, and the R channel may be adopted.

According to the configuration of the first embodiment, a stereo smart mixing that maintains the localization of the priority sound and does not cause the audience member to sense deterioration (missing) of non-priority sound even in a case where the audience member is standing in front of one of the speakers is realized.

Second Embodiment

Figure 4:
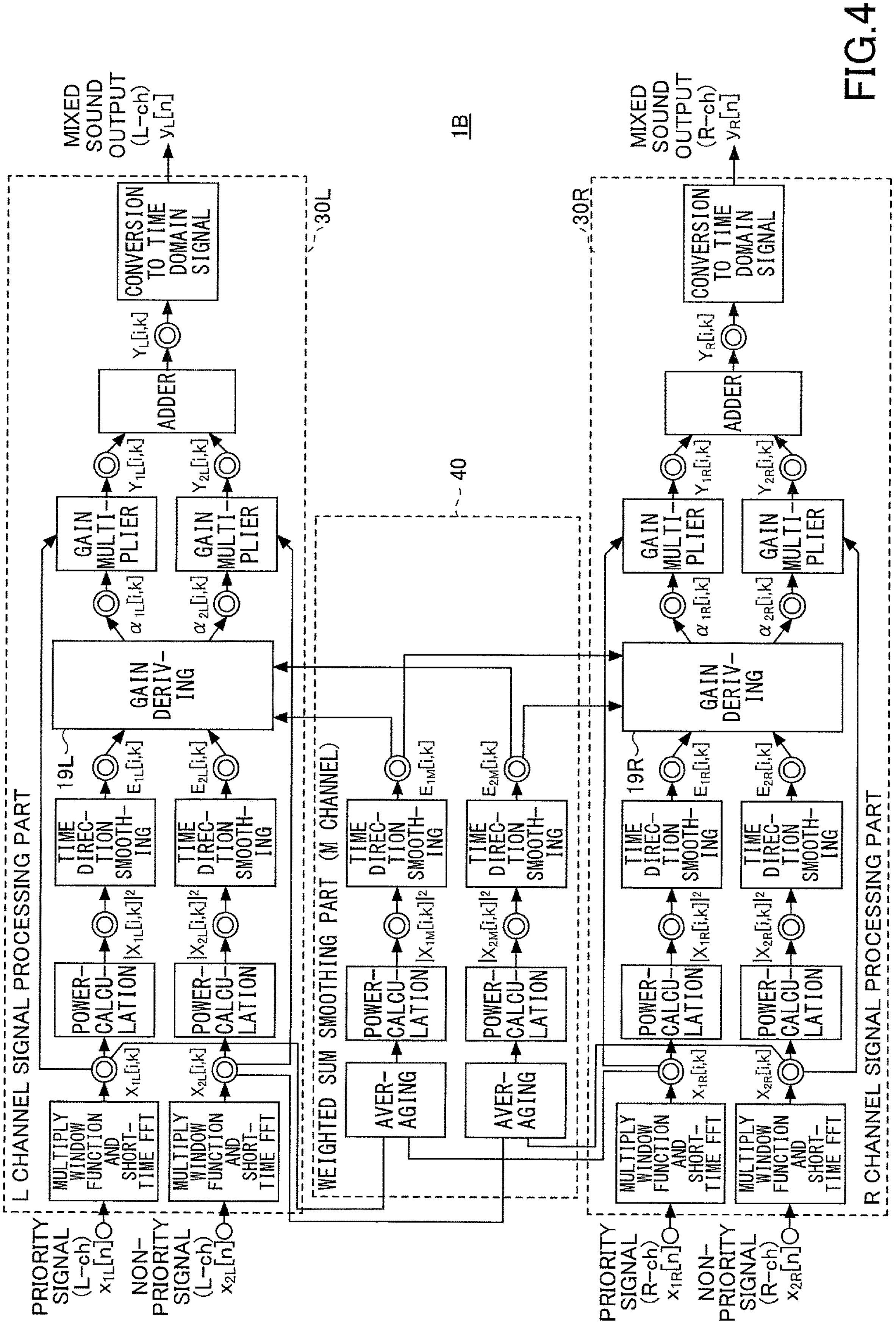
FIG. 4 is an outline block diagram of a mixing apparatus 1B according to a second embodiment.

FIG. 4 is a configuration example of the mixing apparatus 1B according to the second embodiment. In the second embodiment, independent gain masks are used for the L channel and the R channel.

In the first embodiment, the common gain mask is used at the L channel and the R channel. This is for the sake of maintaining the localization of the sound. Since echoes or reverberations are loud in a large hall, the sound at the L channel and the sound at the R channel are mixed together in a space, thereby a sense of localization is weakened. Accordingly, the shifting of the localization is not largely important.

Under such conditions, there is a case where the independent gain masks may be practically used for the L channel and the R channel. However, a simple-parallel-arrangement of two conventional monaural smart mixing systems is insufficient, and an improvement thereof is necessary.

In FIG. 4, although the gain masks are generated independently at the L channel and the R channel, processes based on the principle of fill-in are performed with reference to the signals at the M channel. The configuration of the second embodiment is useful in a case where there is no need to consider an audience member listening to sounds at an extremely close location to one of the speakers, because of the venue's design, settings of audience seats or the like.

As described above, if the L channel and the R channel are mixed with each other in the venue and the sense of the localization is weakened, an application of the principle of fill-in may be accomplished only by monaural (the M channel). It is possible to accommodate or distribute energy (or power) that is considered in a process of the fill-in between the L channel and the R channel, by applying the process of the fill-in only at the monaural. For example, in a case where the L channel contains vocal sound and sound of an instrument, and the R channel only contains sound of the instrument, it is possible to attenuate the sound of the instrument (the non-priority sound) at the L channel, and to attenuate the sound of the instrument at the R channel as well. This makes it possible to increase an articulation of the vocal (an advantage over the first embodiment of FIG. 3). In addition, in a case where the L channel and the R channel (i.e., the center) contain vocal sound, the L channel contains a large sound of an instrument, and the R channel contains a small sound of an instrument, it is possible to make the vocal sound at the L channel louder than the vocal sound at the R channel. As described above, it becomes possible to adjust the gain more precisely. Accordingly, it is possible to increase the articulation of the vocal sound (an advantage over the system of FIG. 2).

The mixing apparatus 1B includes an L channel signal processing part 30L, an R channel signal processing part 30R, and a weighted sum smoothing part 40. The L channel signal processing part 30L includes a gain deriving part 19L, and the R channel signal processing part 30R includes a gain deriving part 19R.

The L channel signal processing part 30L performs a frequency analysis, such as short-time FFT or the like, on an input signal $x_{1L}$ [n] of the priority sound and an input signal $x_{2L}$ [n] of the non-priority sound, and generates a signal $X_{1L}$ [i, k] of the priority sound and a signal $X_{2L}$ [i, k] of the non-priority sound on the time-frequency plane. The signal $X_{1L}$[i, k] of the priority sound and the signal $X_{2L}$[i, k] of the non-priority sound are used in the L channel signal processing part 30L so as to calculate smoothened powers $E_{1L}$[i, k] and $E_{2L}$[i, k], and are also input to the weighted sum smoothing part 40 that forms the M channel. The smoothened powers $E_{1L}$[i, k] and $E_{2L}$[i, k] calculated by the L channel signal processing part 30L are input to the gain deriving part 19L.

The R channel signal processing part 30R performs a frequency analysis, such as short-time FFT or the like, on an input signal $x_{1R}$[n] of the priority sound and an signal $x_{2R}$[n] of the non-priority sound, and generates a signal $X_{1R}$[i, k] of the priority sound and the signal $X_{2R}$[i, k] of the non-priority sound on the time-frequency plane. The signal $X_{1R}$[i, k] of the priority sound and the signal $X_{2R}$[i, k] of the non-priority sound are used in the R channel signal processing part 30R so as to calculate smoothened powers $E_{1R}$[i, k] and $E_{2R}$[i, k], and are also input to the weighted sum smoothing part 40 that forms the M channel. The smoothened powers $E_{1R}$[i, k] and $E_{2R}$[i, k] calculated by the R channel signal processing part 30R are input to the gain deriving part 19R.

The weighted sum smoothing part 40 generates a smoothened power $E_{1M}$[i, k] in the time direction by using an average (or an addition value) of the signal $X_{1L}$[i, k] of the priority sound on the time-frequency plane at the L channel and the signal $X_{1R}$[i, k] of the priority sound on the time-frequency plane at the R channel. Similarly, a smoothened power $E_{2M}$[i, k] in the time direction is generated by using an average (or an addition value) of the signal $X_{2L}$[i, k] of the non-priority signal at the L channel and the signal $X_{2R}$[i, k] of the non-priority signal at the R channel on the time-frequency plane.

The smoothened powers $E_{1M}$[i, k] and $E_{2M}$[i, k] at the M channel are supplied to the gain deriving part 19L of the L channel signal processing part 30L and the gain deriving part 19R of the R channel signal processing part 30R, respectively.

The gain deriving part 19L generates gain masks $\alpha_{1L}$[i, k] and $\alpha_{2L}$[i, k] based on the principle of fill-in by using the four smoothened powers $E_{1L}$[i, k], $E_{2L}$[i, k], $E_{1M}$[i, k], and $E_{2M}$[i, k]. The input signals $X_{1L}$[i, k] and $X_{2L}$[i, k] in time-frequency are multiplied by the gains $\alpha_{1L}$[i, k] and $\alpha_{2L}$[i, k], respectively. An additional signal ($Y_L$[i, k]), of the priority signal and the non-priority signal to which the gains are applied, is restored in the time domain and is output.

The gain deriving part 19R generates gain masks $\alpha_{1R}$[i, k] and $\alpha_{2R}$[i, k] based on the principle of fill-in by using the four smoothened powers $E_{1R}[i, k]$, $E_{2R}[i, k]$, $E_{1M}[i, k]$, and $E_{2M}[i, k]$. The input signals $X_{1R}[i, k]$ and $X_{2R}[i, k]$ in time-frequency are multiplied by the gains $\alpha_{1R}[i, k]$ and $\alpha_{2R}[i, k]$, respectively. An additional signal ($Y_R[i, k]$), of the priority signal and the non-priority signal to which the gains are applied, is restored in the time domain and is output.

Hereinafter, updating of the gain masks $\alpha_{1L}[i, k]$ and $\alpha_{2L}[i, k]$ at the L channel based on the principle of fill-in will be described in detail. Since the same processes as that of the L channel are performed with respect to the gain masks $\alpha_{1R}[i, k]$ and $\alpha_{2R}[i, k]$ at the R channel, the description with respect to the R channel is omitted.

An increase in gain $\alpha_{1L}$ for the priority sound, that is, a calculation of $\alpha_{1L}[i, k]=(1+\Delta_1)\alpha_{1L}[i, k]$, is performed in a case where all of the conditions expressed by formula (47) to (51) are satisfied.

$$P_{1L}[i, k]\geq 1 \quad (47)$$

$$P_{2L}[i, k]\geq 1 \quad (48)$$

$$L_{pL}[i, k]\leq P_{1L}P_{2L} \quad (49)$$

$$(\alpha_{1L}[i-1, k](1+\Delta_1))^2\leq T_{1H}^2 \quad (50)$$

$$L_{pL}[i, k]<T_G^2(P_{1L}[i, k]+P_{2L}[i, k]) \quad 51)$$

Herein, $T_{IH}$ is an upper limit of the gain of the priority sound and $T_G$ is an amplification limit of the mixing power.

A decrease of $\alpha_{1L}$, that is, a calculation of $\alpha_{1L}[i, k]=(1+\Delta_1)^{-1}\alpha_{1L}[i-1, k]$, is performed in a case where any one of formulas (52) to (56) is established and formula (57) is established.

$$P_{1L}[i, k]<1 \quad (52)$$

$$P_{2L}[i, k]<1 \quad (53)$$

$$L_L[i, k]>P_{1L}P_{2L} \quad (54)$$

$$(\alpha_{1L}[i-1, k])^2>T_{1H}^2 \quad (55)$$

$$L_L[i, k]>T_G^2(P_{1L}[i, k]+P_{2L}[i, k]) \quad (56)$$

$$\alpha_{1L}[i-1, k]>1 \quad (57)$$

A decrease of $\alpha_{2L}$ of the non-priority sound, that is, a process of $\alpha_{2L}[i, k]=\alpha_{2L}[i-1, k]-\Delta_2$, is performed in a case where both of conditions expressed by formulas (58) and formula (59) are satisfied.

$$L_{1aM}[i, k]-P_{1M}[i, k]>P_{2M}[i, k]-L_{2mM}[i, k] \quad (58)$$

$$\alpha_{2L}[i-1, k]-\Delta_2\geq T_{2L} \quad (59)$$

Note that the formula (58) is not a fill-in condition for the L channel, but is a fill-in condition for the M channel (monaural). Therefore, energies that are transferred by the fill-in are flexibly distributed between the L channel and the R channel.

An increase in $\alpha_{2L}$, that is, a calculation of $\alpha_{2L}[i, k]=\alpha_{2L}[i-1, k]+\Delta_2$, is performed in a case where both of conditions expressed by formulas (60) and (61) are satisfied.

$$L_{1aM}[i, k]-P_{1M}[i, k]<P_{2M}[i, k]-L_{2M}[i, k] \quad (60)$$

$$\alpha_{2L}[i-1, k]<1 \quad (61)$$

The formula (60) is also a fill-in condition for the M channel (monaural). In a case where the fill-in condition is likely to break down even though accommodation of the energies, that are transferred by the fill-in, is performed between the L channel and the R channel, the breakdown of the fill-in condition is prevented by stopping the increase in $\alpha_{2L}$.

The second embodiment is applicable to the mixing in the large hall with loud echoes or reverberation by referring only to the M channel with respect to the principle of fill-in, and by assuming that the independent gain masks are used at the L channel and the R channel.

Figure 5A:
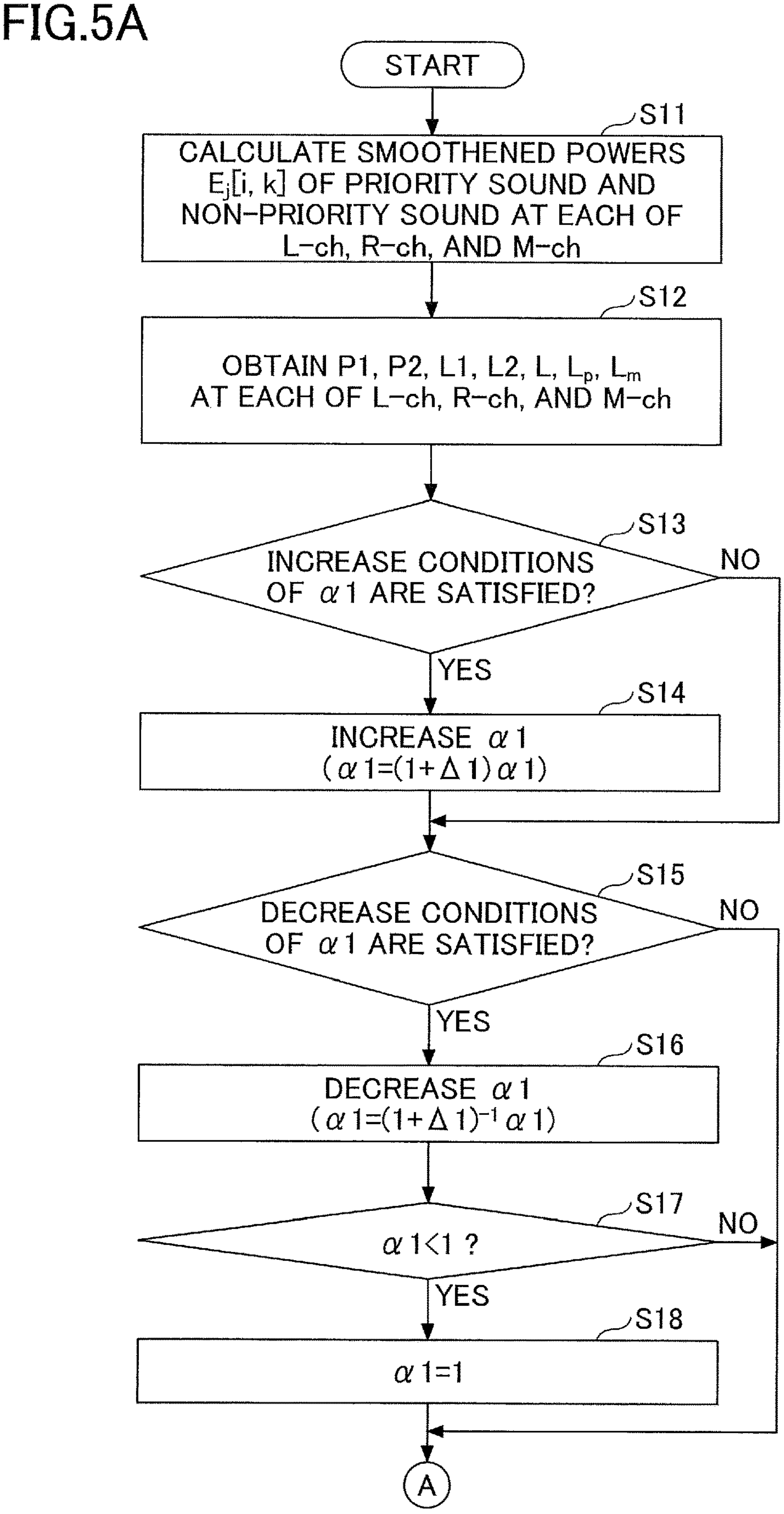
FIG. 5A is a flowchart of a gain updating based on a principle of fill-in according to embodiments.
Figure 5B:
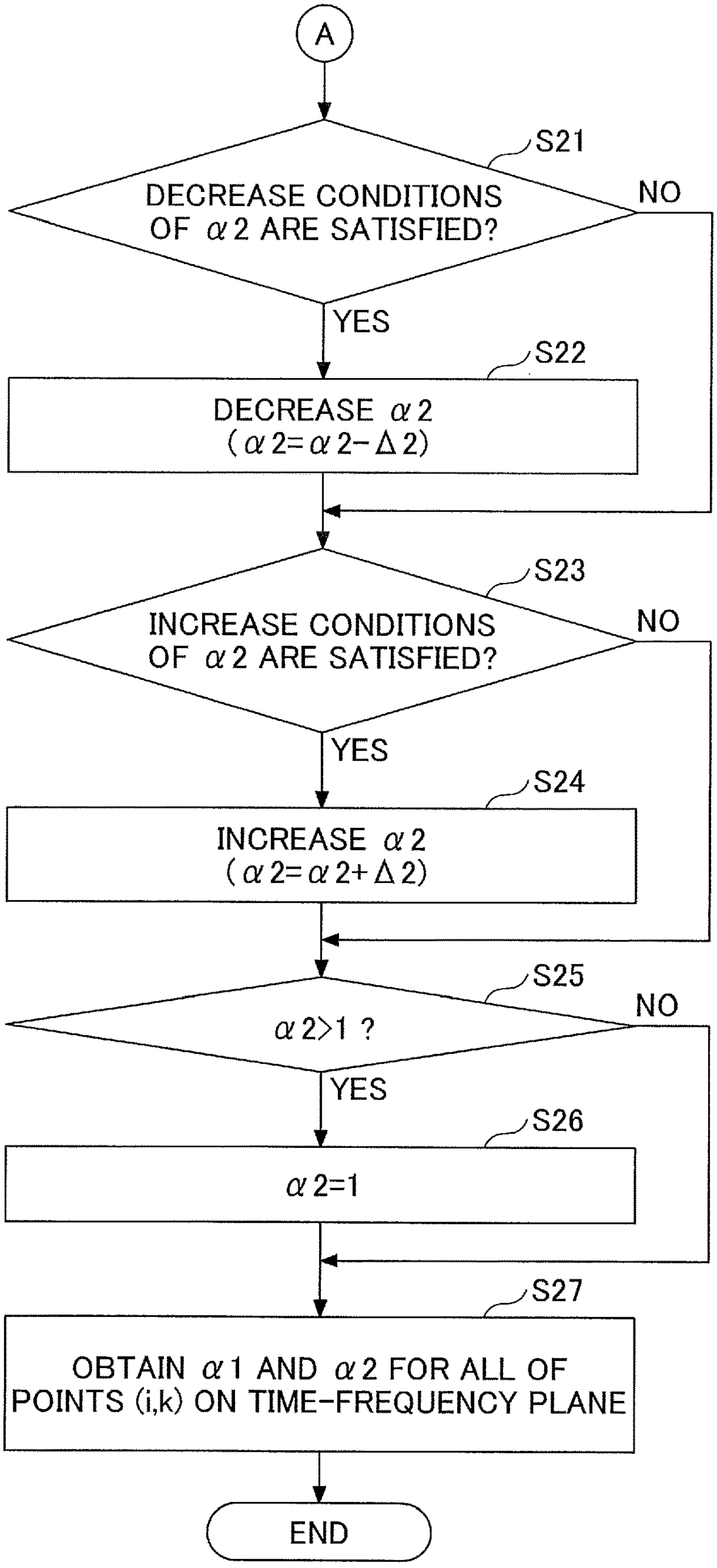
FIG. 5B is a flowchart of the gain updating based on the principle of fill-in according to the embodiments, the flow chart illustrating processes subsequent to S18 in FIG. 5A.

FIGS. 5A and 5B illustrate gain updating flows based on the principle of fill-in performed in the first and second embodiments. In the first and second embodiments, basic flows of gain updating based on the principle of fill-in are the same with each other, although there are differences in that the gain mask is commonly used between the L channel and the R channel or the gain masks are generated independently at the L channel and the R channel.

First, the smoothened powers Ej[i, k] (j=1, 2) of the priority sound and the non-priority sound in the time direction at each of the L channel, the R channel, and the M channel are obtained (S11). Herein, the subscripts identifying the channels are omitted.

The listening correction power P1 of the priority sound, the listening correction power P2 of the non-priority sound, the listening correction power L1 to which the gain α1 before being updated is applied, the listening correction power L2 to which the gain α2 before being updated is applied, the listening correction power L of the mixing power obtained by mixing L1 and L2, the listening correction power Lp of the mixing output at the increase of the gain, and the listening correction power Lm of the mixing output at the decrease of the gain are calculated for each of the L channel, R channel, and M channel (S12).

It is determined whether increase conditions of the gain α1 of the priority sound (formulas (28) to (32) or formulas (47) to (51)) are satisfied (S13). If YES, α1 is increased by a designated step size (S14), and the flow proceeds to S15. If the increase conditions of α1 are not satisfied (NO at S13), the flow directly proceeds to step S15.

Next, it is determined whether decrease conditions of α1 (formulas (33) to (38) or formulas (52) to (57)) are satisfied (S15). If the decrease conditions of α1 are not satisfied, the flow proceeds directly to processes of the gain α2 of the non-priority sound as illustrated in FIG. 5B. If the decrease conditions of α1 are satisfied (YES at S15), α1 is decreased at a designated rate (S16). It is determined whether α1 after the decrease is less than 1 (α1<1) (S17). If α1 is less than 1 (YES at S17), α1 is set to 1 (S18), and the flow proceeds to the processes of α2. Thus, in a case where α1 is decreased to a value less than 1, α1 recovers to 1. If α1 is greater than or equal to 1 (NO at S17), the flow proceeds directly to the processes of α2.

Referring to FIG. 5B, it is determined whether decrease conditions of the gain α2 of the non-priority sound (formulas (39) to (42) or formulas (58) to (59)) are satisfied (S21). If YES, α2 is decreased by a designated step size (S22) and the flow proceeds to S23. If the decrease conditions of α2 are not satisfied (NO at S21), the flow proceeds directly to step S23.

Next, it is determined whether increase conditions of α2 (formulas (43) to (46) or formulas (60) to (61)) are satisfied (S23). If the increase conditions of α2 are satisfied, α2 is increased by a designated step size (S24), and it is determined whether α2 after being increased becomes greater than 1 (α2>1) (S25). If α2 exceeds 1 (YES at S25), α2 is set to 1 (α2=1) (S26), and if α2 does not exceed 1 (NO at S25), the present value is maintained.

At step S23, if the increase conditions of $\alpha2$ are not satisfied (NO at S23), the flow proceeds to step S25, and it is determined whether the present $\alpha2$ is greater than 1 ($\alpha2>1$). If $\alpha2$ exceeds 1 (YES at S25), $\alpha2$ is set to 1 ($\alpha2=1$) (S26), and if $\alpha2$ does not exceed 1, the present value is maintained.

The above-described processes are repeatedly performed for all of the points on the time-frequency plane (S27), and then the processing is completed.

According to the present invention, upon generating the common gain mask, the gains are determined so that at least the principle of fill-in with respect to the output at the L channel and the principle of fill-in with respect to the output at the R channel, among the principle of fill-in with respect to the output at the L channel, the principle of fill-in with respect to the output at the R channel, and the principle of fill-in with respect to (the weighted sum) of the output at the L channel and the output at the R channel, are satisfied simultaneously (first embodiment).

Accordingly, it is possible to realize the stereo smart mixing that maintains the localization and does not cause the audience member to sense deterioration (missing) of the non-priority sound even if an audience member is in front of one of the speakers.

In a case where independent gain masks are used for the L channel and the R channel, the gains are determined so that the principle of fill-in with respect to the weighted sum (i.e., the M channel) of the output at the L channel and the output at the R channel are satisfied (second embodiment).

Accordingly, it is possible to adjust the gains precisely by using the independent gain masks at the L channel and the R channel in the hall or the like where the sounds of the L channel and the R channel are strongly mixed. Moreover, it is possible to realize the stereo smart mixing that can output the priority sound more clearly by applying the principle of fill-in in the monaural manner.

The mixing apparatuses 1A and 1B of the embodiments can be realized by a logic device such as a field programmable gate array (FPGA), programmable logic device (PLD), or the like, and can also be realized by a processor that executes a mixing program.

The configurations and the techniques of the present invention can be applicable not only to a commercial mixing apparatus at a concert venue and a recording studio, but also to an amateur mixer, a digital audio workstation (DAW), and a stereo reproducing performed at an application or the like for smartphone.

This application claims priority to Japanese Patent Application No. 2018-080671, filed Apr. 19, 2018, the entire contents of which are hereby incorporated by reference.

DESCRIPTION OF THE REFERENCE NUMERALS

1, 1A, 1B mixing apparatus
10L, 30L channel signal processing part
10R, 30R R channel signal processing part
19, 19L, 19R gain deriving part
20 gain mask generating part
40 weighted sum smoothing part

The invention claimed is:

1. A mixing apparatus that outputs stereophonic output, the mixing apparatus comprising:

a first signal processor that mixes a first signal and a second signal at a first channel;

a second signal processor that mixes a third signal and a fourth signal at a second channel;

a third channel that processes a weighted sum of a signal at the first channel and a signal at the second channel; and a gain deriving part that generates a gain mask commonly used in the first channel and the second channel;

wherein the gain deriving part determines a first gain commonly applied to the first signal and the third signal, and a second gain commonly applied to the second signal and the fourth signal so that designated conditions for gain generations are satisfied simultaneously at least at the first channel and the second channel among the first channel, the second channel, and the third channel, wherein the designated conditions are that a decrease in power of the second signal does not exceed an increase amount in power of the first signal and a decrease in power of the fourth signal does not exceed an increase amount in power of the third signal, the designated conditions being satisfied at the first channel, the second channel, and the third channel, wherein the first signal processor calculates a first power pair including smoothened power of the first signal and the second signal in a time direction at each point on a time-frequency plane, wherein the second signal processor calculates a second power pair including smoothened power of the third signal and the fourth signal in the time direction at each point on the time-frequency plane, and wherein the third channel calculates a third power pair including smoothened power in the time direction based on the weighted sum.

2. The mixing apparatus as claimed in claim 1, wherein the designated conditions are satisfied at the first channel, the second channel, and the third channel, simultaneously.

3. A mixing apparatus that outputs stereophonic output, the mixing apparatus comprising:

a first signal processor that mixes a first signal and a second signal at a first channel;

a second signal processor that mixes a third signal and a fourth signal at a second channel;

a third channel that processes a weighted sum of a signal at the first channel and a signal at the second channel;

a first gain deriving part that generates a first gain mask used in the first channel; and a second gain deriving part that generates a second gain mask used in the second channel;

wherein the first gain deriving part generates the first gain mask so that a designated condition for a gain generation is satisfied at the third channel, and wherein the second gain deriving part generates the second gain mask so that the designated condition is satisfied at the third channel, wherein the designated condition is that a decrease of a weighted-sum-power of the second signal and the fourth signal does not exceed an increase amount of a weighted-sum-power of the first signal and the third signal, wherein the first signal processor calculates a first power pair including smoothened power of the first signal and the second signal in a time direction at each point on a time-frequency plane, wherein the second signal processor calculates a second power pair including smoothened power of the third signal and the fourth signal in the time direction at each point on the time-frequency plane, wherein the third channel calculates a third power pair including smoothened power in the time direction based on the weighted sum, wherein the first gain deriving part generates the first gain mask by using the first power pair and the third power pair, and wherein the second gain deriving part generates the second gain mask by using the second power pair and the third power pair.

4. A mixing method that performs stereophonic output, the mixing method comprising:

inputting a first signal and a second signal at a first channel;

inputting a third signal and a fourth signal at a second channel;

processing, at a third channel, a weighted sum of a signal at the first channel and a signal at the second channel;

generating a gain mask commonly used in the first channel and the second channel based on an output at the first channel, an output at the second channel, and an output at the third channel, applying the gain mask to the first channel and mixing the first signal and the second signal; and applying the gain mask to the second channel and mixing the third signal and the fourth signal;

wherein the gain mask is generated so that designated conditions for gain generations are satisfied simultaneously at least at the first channel and the second channel among the first channel, the second channel, and the third channel, wherein the designated conditions are that a decrease in power of the second signal does not exceed an increase amount in power of the first signal and a decrease in power of the fourth signal does not exceed an increase amount in power of the third signal, wherein the first channel calculates a first power pair including smoothened power of the first signal and the second signal in a time direction at each point on a time-frequency plane are calculated, wherein the second channel calculates a second power pair including smoothened power of the third signal and the fourth signal in the time direction at each point on the time-frequency plane, wherein the third channel calculates a third power pair including smoothened power in the time direction based on the weighted sum, and wherein the first gain and the second gain are determined by using the first power pair, the second power pair, and the third power pair.

5. A mixing method that performs stereophonic output, the mixing method comprising:

inputting a first signal and a second signal at a first channel;

inputting a third signal and a fourth signal at a second channel;

processing, at a third channel, a weighted sum of a signal at the first channel and a signal at the second channel;

generating a first gain mask used in the first channel based on an output at the first channel and an output at the third channel; and generating a second gain mask used in the second channel based on an output at the second channel and an output at the third channel;

wherein the first gain mask and the second gain mask are generated so that a designated condition for gain generation is satisfied at the third channel, wherein the designated condition is that a decrease of a weighted-sum-power of the second signal and the fourth signal does not exceed an increase amount of a weighted-sum-power of the first signal and the third signal, wherein the first channel calculates a first power pair including smoothened power of the first signal and the second signal in a time direction at each point on a time-frequency plane, wherein the second channel calculates a second power pair including smoothened power of the third signal and the fourth signal in the time direction at each point on the time-frequency plane, wherein the third channel calculates a third power pair including smoothened power in the time direction based on the weighted sum, wherein the first gain mask is generated by using the first power pair and the third power pair, and wherein the second gain mask is generated by using the second power pair and the third power pair.

6. A non-transitory computer-readable recording medium having computer-readable instructions stored thereon, which when executed, causes a processor to execute a mixing process, the mixing process comprising:

obtaining a first signal and a second signal at a first channel;

obtaining a third signal and a fourth signal at a second channel;

processing, at a third channel, a weighted sum of a signal at the first channel and a signal at the second channel;

generating a gain mask commonly used in the first channel and the second channel based on an output at the first channel, an output at the second channel, and an output at the third channel, applying the gain mask to the first channel and mixing the first signal and the second signal; and applying the gain mask to the second channel and mixing the third signal and the fourth signal;

wherein the gain mask is generated so that designated conditions for gain generations are satisfied simultaneously at least at the first channel and the second channel among the first channel, the second channel, and the third channel, wherein the designated conditions are that a decrease in power of the second signal does not exceed an increase amount in power of the first signal and a decrease in power of the fourth signal does not exceed an increase amount in power of the third signal, wherein the first channel calculates a first power pair including smoothened power of the first signal and the second signal in a time direction at each point on a time-frequency plane are calculated, wherein the second channel calculates a second power pair including smoothened power of the third signal and the fourth signal in the time direction at each point on the time-frequency plane, wherein the third channel calculates a third power pair including smoothened power in the time direction based on the weighted sum, and wherein the first gain and the second gain are determined by using the first power pair, the second power pair, and the third power pair.

7. A non-transitory computer-readable recording medium having computer-readable instructions stored thereon, which when executed, causes a processor to execute a mixing process, the mixing process comprising:

obtaining a first signal and a second signal at a first channel;

obtaining a third signal and a fourth signal at a second channel;

processing, at a third channel, a weighted sum of a signal at the first channel and a signal at the second channel;

generating a first gain mask used in the first channel based on an output at the first channel and an output at the third channel; and generating a second gain mask used in the second channel based on an output at the second channel and an output at the third channel;

wherein the first gain mask and the second gain mask are generated so that a designated condition for a gain generation is satisfied at the third channel, wherein the designated condition is that a decrease of a weighted-sum-power of the second signal and the fourth signal does not exceed an increase amount of a weighted-sum-power of the first signal and the third signal, wherein the first channel calculates a first power pair including smoothened power of the first signal and the second signal in a time direction at each point on a time-frequency plane, wherein the second channel calculates a second power pair including smoothened power of the third signal and the fourth signal in the time direction at each point on the time-frequency plane, wherein the third channel calculates a third power pair including smoothened power in the time direction based on the weighted sum, wherein the first gain mask is generated by using the first power pair and the third power pair, and wherein the second gain mask is generated by using the second power pair and the third power pair.

* * * * *